United States Patent
Tanabe

(10) Patent No.: US 6,975,548 B2
(45) Date of Patent: Dec. 13, 2005

(54) MEMORY DEVICE HAVING REDUNDANT MEMORY CELL

(75) Inventor: Tetsuya Tanabe, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 11 days.

(21) Appl. No.: 10/812,424

(22) Filed: Mar. 30, 2004

(65) Prior Publication Data

US 2004/0213057 A1 Oct. 28, 2004

(30) Foreign Application Priority Data

Mar. 31, 2003 (JP) ........................................ 2003-095824

(51) Int. Cl.$^7$ ................................................. G11C 7/00
(52) U.S. Cl. ............... 365/200; 365/189.07; 365/225.7; 365/230.03
(58) Field of Search ........................... 365/200, 189.07, 365/225.7, 230.03

(56) References Cited

U.S. PATENT DOCUMENTS 6,178,127 B1 * 1/2001 Haraguchi .................. 365/200
6,418,067 B1 * 7/2002 Watanabe et al. ........... 365/200

FOREIGN PATENT DOCUMENTS

JP          11-168143          6/1999
JP          2001-243789        9/2001

* cited by examiner

*Primary Examiner*—Huan Hoang
(74) *Attorney, Agent, or Firm*—Volentine Francos & Whitt, PLLC

(57) ABSTRACT

A semiconductor memory device includes a plurality of memory cell arrays, a plurality of redundant judgment circuits, and a redundant memory cell array. Each of the redundant judgment circuits is used for storing an address of a defective memory cell in the corresponding memory cell array and each of the redundant judgment circuits includes a block judgment unit which outputs a block judgment signal and an address judgment unit which outputs a redundant judgment signal. The block judgment unit outputs the block judgment signal when the corresponding memory cell array includes the defective memory cell. The address judgment unit outputs the redundant judgment signal when the block judgment signal is outputted from the block judgment unit and the address of the defective memory cell matches an external address.

10 Claims, 8 Drawing Sheets

[図 5]

MEMORY DEVICE HAVING REDUNDANT MEMORY CELL

CROSS REFERENCE TO RELATED APPLICATION

A claim of priority under 35 U.S.C. §119 is made to Japanese Patent Application No. 2003-95824, filed Mar. 31, 2003, which is herein incorporated by reference in its entirety for all purposes.

BACKGROUND OF THE INVENTION

1. Field of the Invention

The present invention relates to a semiconductor memory device which has a redundant memory cell.

2. Description of the Related Art

A DRAM (Dynamic Random Access Memory) has a problem of a yield decreasing, causing a defective memory cell. Recently, for increasing the yield, a redundant memory cell array for saving the defective memory cell has been used in the DRAM.

An address of the defective memory cell is detected by a test that includes writing data to each of the memory cells and reading the data from each of the memory cells.

When the address of a defective memory cell is detected, the address is programmed in a fuse ROM (Read Only Memory) which is included in a redundant judgment circuit. When the memory cell array is accessed from an external device, the redundant judgment circuit which is programmed with the defective address information judges whether or not the defective memory cell is accessed. If the accessing is performed to the defective memory cell, the accessing to the memory cell array which includes the defective memory cell is changed to accessing a redundant memory cell array by the redundant judgment circuit. As a result, the semiconductor memory device which includes the defective memory cell can be operated as a normal product.

Recently, it is needed to reduce power consumption in the DRAM. A technique for reducing power consumption is disclosed in Japanese Patent Laid-Open No. 11-168143.

The reference discloses a semiconductor memory device which has a plurality of redundant circuits. Each redundant circuit includes a fuse for redundant operation and a fuse for preventing a pass through current, and one of the fuses is cut. Accordingly, the pass through current is prevented, and the power consumption in the semiconductor device is reduced.

In a semiconductor memory device for high-speed operation such as a synchronous DRAM, the memory cell array is divided into a plurality of blocks and each block is accessed independently. The redundant memory cell array and the redundant judgment circuit are provided in each block.

The reference discloses a technique for reducing the power consumption in the redundant judgment circuit in the synchronous DRAM. However, the technique cannot be applied with a semiconductor memory device which has a plurality of memory cell blocks and a plurality of redundant judgment circuits.

A scheme for reducing the power consumption in the redundant judgment circuits in the respective blocks is needed for reducing the power consumption of the semiconductor memory device.

SUMMARY OF THE INVENTION

Accordingly, in one aspect of the present invention, a semiconductor device for reducing power consumption is provided. The semiconductor memory device comprises a plurality of memory cell arrays, a plurality of redundant judgment circuits, and a redundant memory cell array. Each of the redundant judgment circuits is used for storing an address of a defective memory cell in the corresponding memory cell array, and each of the redundant judgment circuits includes a block judgment unit which outputs a block judgment signal and an address judgment unit which outputs a redundant judgment signal. The block judgment unit outputs the block judgment signal when the corresponding memory cell array includes the defective memory cell. The address judgment unit outputs the redundant judgment signal when the block judgment signal is outputted from the block judgment unit and the address of the defective memory cell matches an external address.

DETAILED DESCRIPTION OF THE PREFERRED EMBODIMENTS

Figure 1:
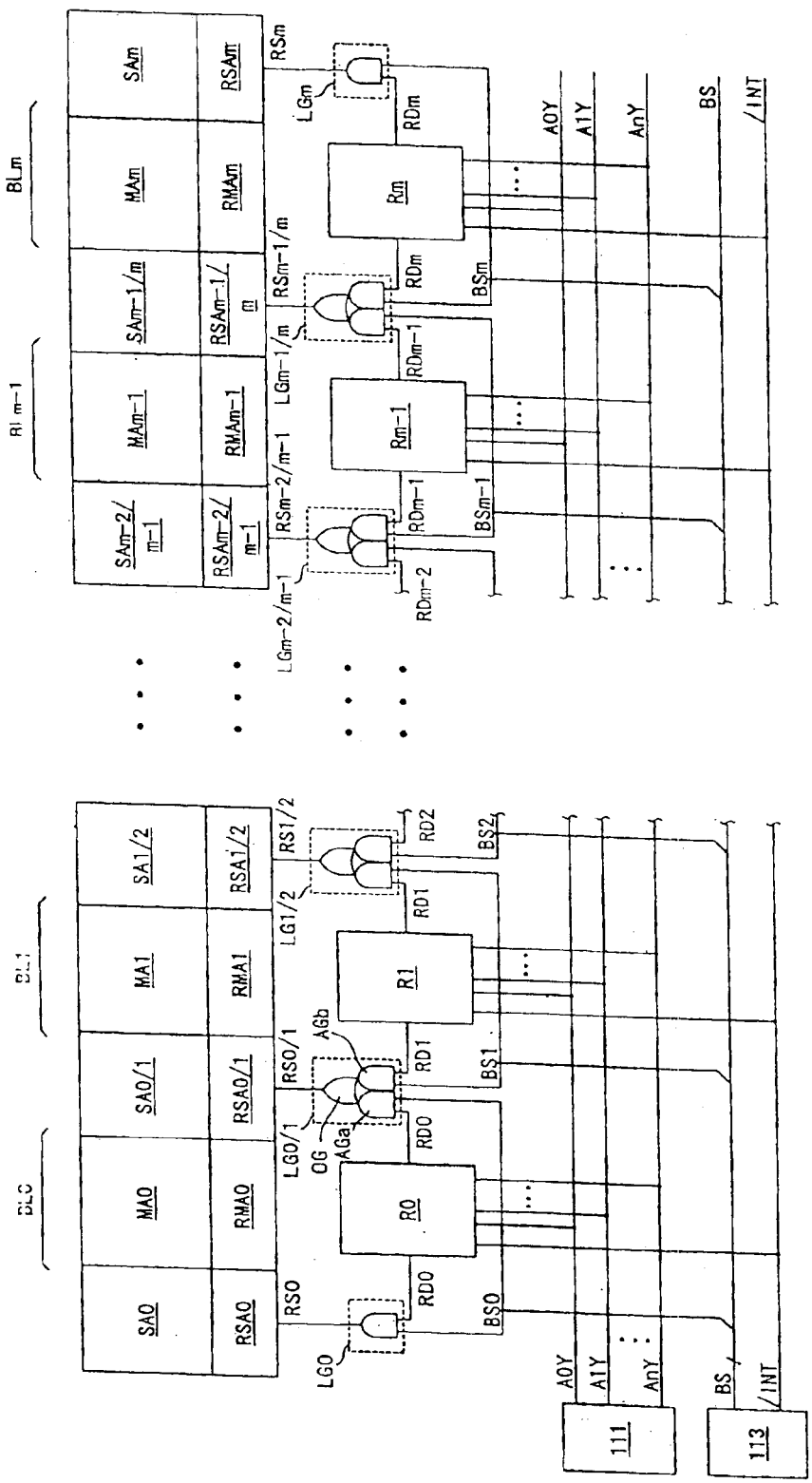
FIG. 1 is a block diagram showing a DRAM of a first embodiment of a present invention.

A semiconductor memory device according to preferred embodiments of the present invention will be explained hereinafter with reference to the accompanying figures. In order to simplify the explanation, like elements are given like or corresponding reference numerals. Dual explanations of the same elements are avoided.

FIG. 1 is a block diagram showing a DRAM 101 of a first embodiment of the present invention. The DRAM 101 includes m+1 blocks BL0 to BLm. The blocks BL0 to BLm include memory cell arrays MA0 to MAm, redundant memory arrays RMA0 to RMAm, and redundant judgment circuit R0 to Rm respectively. That is, the block BLk (0≦k≦m) includes the memory cell array MAk, the redundant memory cell array RMAk and the redundant judgment circuit Rk. Accordingly, the memory cell array is divided to the m+1 blocks and accessed for each blocks, a data writing operation and a data reading operation can be performed with high-speed.

If any of the memory cell arrays MA0 to MAm includes the defective memory portion, the defective memory portion is replaced by the normal memory cell in the corresponding redundant memory cell arrays RMA0 to RMAm. The redundant judgment circuits R0 to Rm judge the replacement.

Sense amplifier units SA0/1, SA1/2, . . . , SAm−1/m are arranged between each memory cell arrays MA0 to MAm. A sense amplifier SA0 is arranged outside of the memory cell array MA0 and a sense amplifier SAm is arranged outside of the memory cell array MAm.

The sense amplifier SA0/1 and the sense amplifier SA1/2 read data from the memory cell array MA1 by amplifying a voltage of a bit line in the memory cell array MA1 and write data to the memory cell array MA1. Also, other sense amplifiers perform the writing operation and the reading operation to the adjacent memory cell arrays. That is, each of sense amplifiers SA0/1 to SAm-1/m are shared by the memory cell arrays which are arranged at both sides of these sense amplifiers.

The redundant sense amplifiers RSA0 to RSAm are used for the redundant memory cell arrays RMA0 to RMAm. The relationship between the redundant memory cell arrays RMA0 to RMAM and the redundant sense amplifiers RSA0 to RSAm is substantially same as the relationship between the memory cell arrays MA0 to MAm and the sense amplifiers SA0 to SAm. That is, the redundant sense amplifier RSA0/1 and the redundant sense amplifier RSA1/2 read data from the redundant memory cell array RMA by amplifying a voltage of a bit line in the redundant memory cell array RMA1 and write data to the redundant memory cell array RMA1. Also, other redundant sense amplifiers perform the data writing operation and the data reading operation to the adjacent redundant memory cell arrays. That is, each of redundant sense amplifiers RSA0/1 to RSAm-1/m are shared by the redundant memory cell arrays which are arranged at both side of the redundant sense amplifier.

Logic gates LG0/1, LG1/2, ..., LGm-1/m are arranged between each redundant judgment circuit R0 to Rm. Each of the logic gates includes two AND gates and an OR gate. A logic gate LG0 is arranged outside of the redundant judgment circuit R0 and a logic gate LGm is arranged outside of the redundant judgment circuit Rm. Each of the logic gates LG0 and LGm includes an AND gate.

For example, the logic gate LG0/1 which is arranged between the redundant judgment circuit R0 and the redundant judgment circuit R1 includes the AND gate AGa, the AND gate AGb and the OR gate OG. The AND gate AGa has input thereto a block selecting signal BS0 from a control unit 113 and a redundant judgment signal RD0 from the redundant judgment circuit R0. The AND gate AGb has input thereto a block selecting signal BS1 from the control unit 113 and a redundant judgment signal RD1 from the redundant judgment circuit R1. Output terminals of the AND gates AGa and AGb are connected to input terminals of the OR gate OG. An output terminal of the OR gate OG is connected to an input terminal of the redundant sense amplifier RSA0/1.

The redundant judgment circuits R0 to Rm have input thereto address signals A0Y to AnY from an address buffer unit 111 and an initializing signal/INT from the control unit 113.

Figure 2:
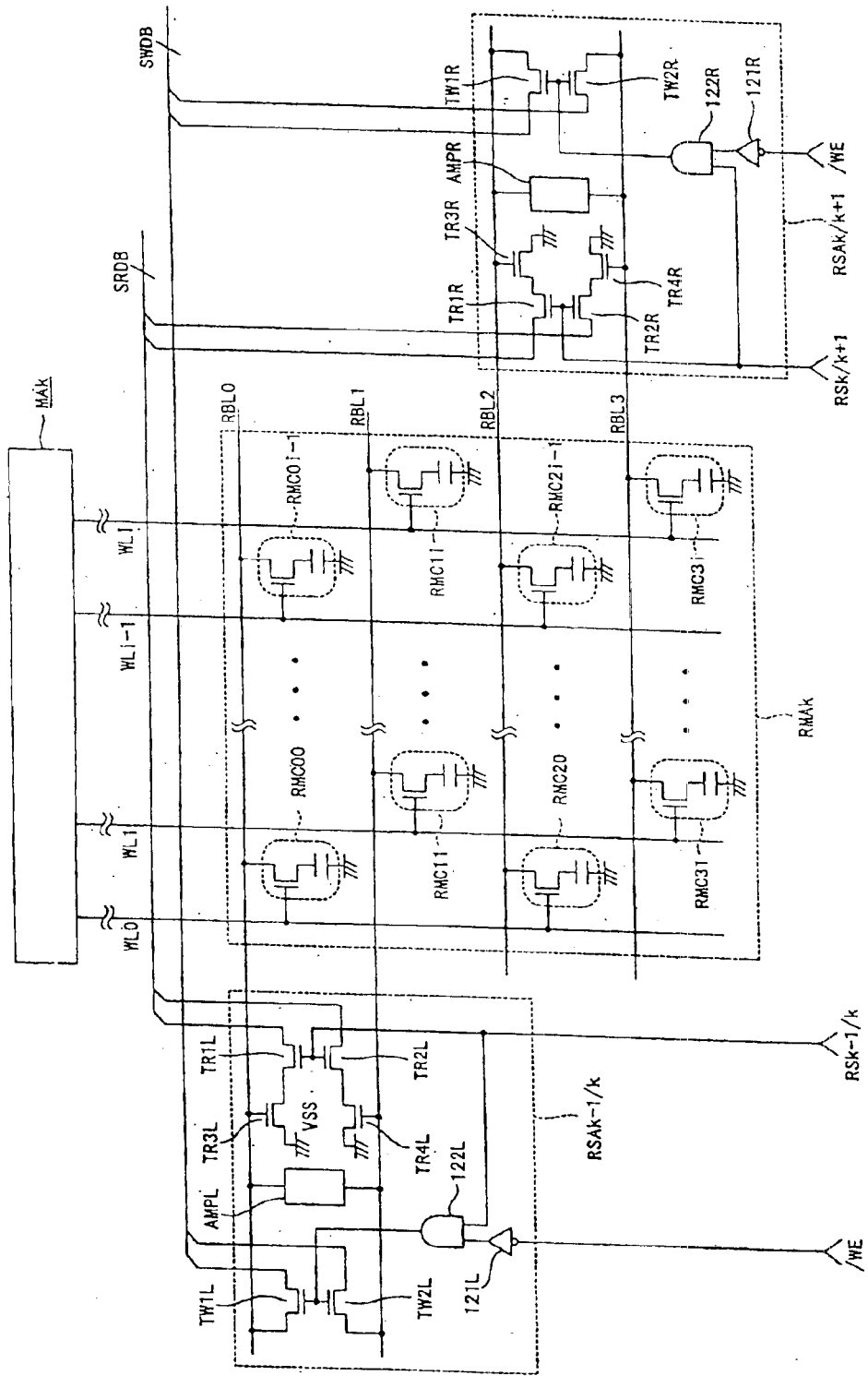
FIG. 2 is a circuit diagram showing a DRAM of the first embodiment of the present invention.

Next, a structure of the redundant memory cell arrays RMA0 to RMAm and the redundant sense amplifiers RSA0 to RSAm are described with reference to FIG. 2. Each of the redundant memory cell arrays RMA0 to RMAm has a same structure and each of the redundant sense amplifiers RSA0 to RSAm has a same structure. Therefore, in this embodiment, the redundant memory cell array RMAk ($0 \leq k \leq m$) and the sense amplifiers RSAk-1/k and RSAk/k+1 which are arranged at both sides of the redundant memory cell array RMAk are described.

The redundant memory cell array RMAk includes four bit lines RBL0 to RBL3, i+1 word lines WL0 to WLi and a plurality of memory cells RMC00 to RMC3i. Each of the memory cells RMC00 to RMC 3i includes one transistor and one capacitor.

The word lines WL0 to WLi are extended from the redundant memory cell array RMAk to the memory cell array MAk.

The bit lines RBL0 and RBL1 are extended from the redundant memory cell array RMAk to the redundant sense amplifier unit RSAk-1/k. The bit lines RBL2 and RBL3 are extended from the redundant memory cell array RMAk to the redundant sense amplifier RSAk/k+1.

The redundant sense amplifier RSAk-1/k includes N-channel transistors TR1L, TR2L, TR3L and TR4L for the reading operation, N-channel transistors TW1L and TW2L for the writing operation, an inverter 121L, an AND gate 122L, and an amplifier AMPL.

The transistors TR1L, TR2L, TR3L and TR4L form a data reading unit in the redundant sense amplifier RSAk-1/k. The transistors TW1L and TW2L, the inverter 121L, and the AND gate 122L form a data writing unit in the redundant sense amplifier RSAk-1/k.

A gate electrode of the transistor TR1L and a gate electrode of the transistor TR2L are connected to a redundant selecting signal line which transfers a redundant selecting signal RSk-1/k. A drain electrode of the transistor TR1L and a drain electrode of the transistor TR2L are connected to a sub read data bus SRDB. A source electrode of the transistor TR1L is connected to a drain electrode of the transistor TR3L, and a source electrode of the transistor TR2L is connected to a drain electrode of the transistor TR4L.

A gate electrode of the transistor TR3L is connected to the bit line RBL0, and a gate electrode of the transistor TR4L is connected to the bit line RBL1. A drain electrode of the transistor TR3L and a drain electrode of the transistor TR4L are connected to a second power supply voltage VSS(ground level).

A gate electrode of the transistor TW1L and a gate electrode of the transistor TW2L are connected to an output terminal of the AND gate 122L. A drain electrode of the transistor TW1L and a drain electrode of the transistor TW2L are connected to a sub write data bus SWDB. A source electrode of the transistor TW1L is connected to the bit line RBL0, and a source electrode of the transistor TW2L is connected to the bit line RBL1.

A first input terminal of the AND gate 122L is connected to the redundant selecting signal line which transfers the redundant selecting signal RSk-1/k, and a second input terminal of the AND gate 122L is connected to an output terminal of the inverter 121L. An input terminal of the inverter 121L is connected to a write enable signal line which transfers a write enable signal/WE.

The amplifier AMPL is connected between the bit line RBL0 and the bit line RBL1. The amplifier AMPL amplifies a voltage between the bit line RBL0 and the bit line RBL1.

The redundant sense amplifier unit RSAk-1/k is used for accessing the redundant memory cells RMC 00, RMC11, ..., RMC0i-1, RMC1i which are connected to the bit lines RBL0 and RBL1.

The redundant sense amplifier unit RSAk/k+1 is used for accessing the redundant memory cells RMC20, RMC31, ..., RMC2i-1, RMC3i which are connected to the bit lines RBL2 and RBL3.

The redundant sense amplifier unit RSAk/k+1 includes N-channel transistors TR1R, TR2R, TR3R and TR4R for the writing operation, N-channel transistors TW1R and TW2R for the reading operation, an inverter 121R, an AND gate 122R, and an amplifier AMPR.

The transistors TR1R, TR2R, TR3R and TR4R form a data reading unit in the redundant sense amplifier RSAk/k+1. The transistors TW1R and TW2R, the inverter 121R, and the AND gate 122R form a data writing unit in the redundant sense amplifier RSAk/k+1.

A gate electrode of the transistor TR1R and a gate electrode of the transistor TR2R are connected to a redundant selecting signal line which transfers a redundant selecting signal RSk/k+1. A drain electrode of the transistor TR1R and a drain electrode of the transistor TR2R are connected to the sub read data bus SRDB. A source electrode of the transistor TR1R is connected to a drain electrode of the transistor TR3R, and a source electrode of the transistor TR2R is connected to a drain electrode of the transistor TR4R.

A gate electrode of the transistor TR3R is connected to the bit line RBL2, and a gate electrode of the transistor TR4R is connected to the bit line RBL3. A drain electrode of the transistor TR3R and a drain electrode of the transistor TR4R are connected to the second power supply voltage VSS (ground level).

A gate electrode of the transistor TW1R and a gate electrode of the transistor TW2R are connected to an output terminal of the AND gate 122R. A drain electrode of the transistor TW1R and a drain electrode of the transistor TW2R are connected to the sub write data bus SWDB. A source electrode of the transistor TW1R is connected to the bit line RBL2, and a source electrode of the transistor TW2L is connected to the bit line RBL3.

A first input terminal of the AND gate 122R is connected to the redundant selecting signal line which transfers the redundant selecting signal RSk/k+1, and a second input terminal of the AND gate 122R is connected to an output terminal of the inverter 121R. An input terminal of the inverter 121R is connected to a write enable signal line which transfers a write enable signal /WE.

The amplifier AMPR is connected between the bit line RBL2 and the bit line RBL3. The amplifier AMPR amplifies a voltage between the bit line RBL2 and the bit line RBL3.

In this embodiment, the redundant memory cell array RMAk includes the four bit lines RBL0 to RBL3. A number of the bit lines can be increased. For example, when the redundant memory cell array RMAk has eight bit lines, each of the redundant sense amplifier units RSAk−1/k and RSAk/k+1 may include two sets of the writing unit and the reading unit.

Next, a structure of the memory cell arrays MA0 to MAm and a structure of the sense amplifier units SA0 to SAm are described.

If any of the memory cell arrays MA0 to MAm includes the defective portion, the defective portion is replaced by a corresponding portion in the redundant memory cell arrays RMA0 to RMAm. Therefore, the memory cell arrays MA0 to MAm have a similar structure to the redundant memory cell arrays RMA0 to RMAm in a direction that the bit line is extended. That is, each of the memory cell arrays MA0 to MAm includes a plurality of bit lines, i+1 word lines WL0 to WLi, and memory cells each of which is arranged at intersections of each of the bit lines and each of the word lines.

Since each of the memory cell arrays MA0 to MAm includes the plural bit lines, each of the sense amplifier units SA0 to SAm includes a plurality of data writing units and a plurality of data reading units. A structure of the data writing unit and a structure of the data reading unit in the sense amplifier units SA0 to SAm are the same as the structure of the data writing unit and the data reading unit in the redundant sense amplifier unit RSAk−1/k which are shown in FIG. 2.

Next, a structure of the redundant judgment circuits R0 to Rm is described. Each of the redundant judgment circuits R0 to Rm has a similar structure. Therefore, in this embodiment, one of the redundant judgment circuit Rk($0 \leq k \leq m$) is described.

Figure 3:
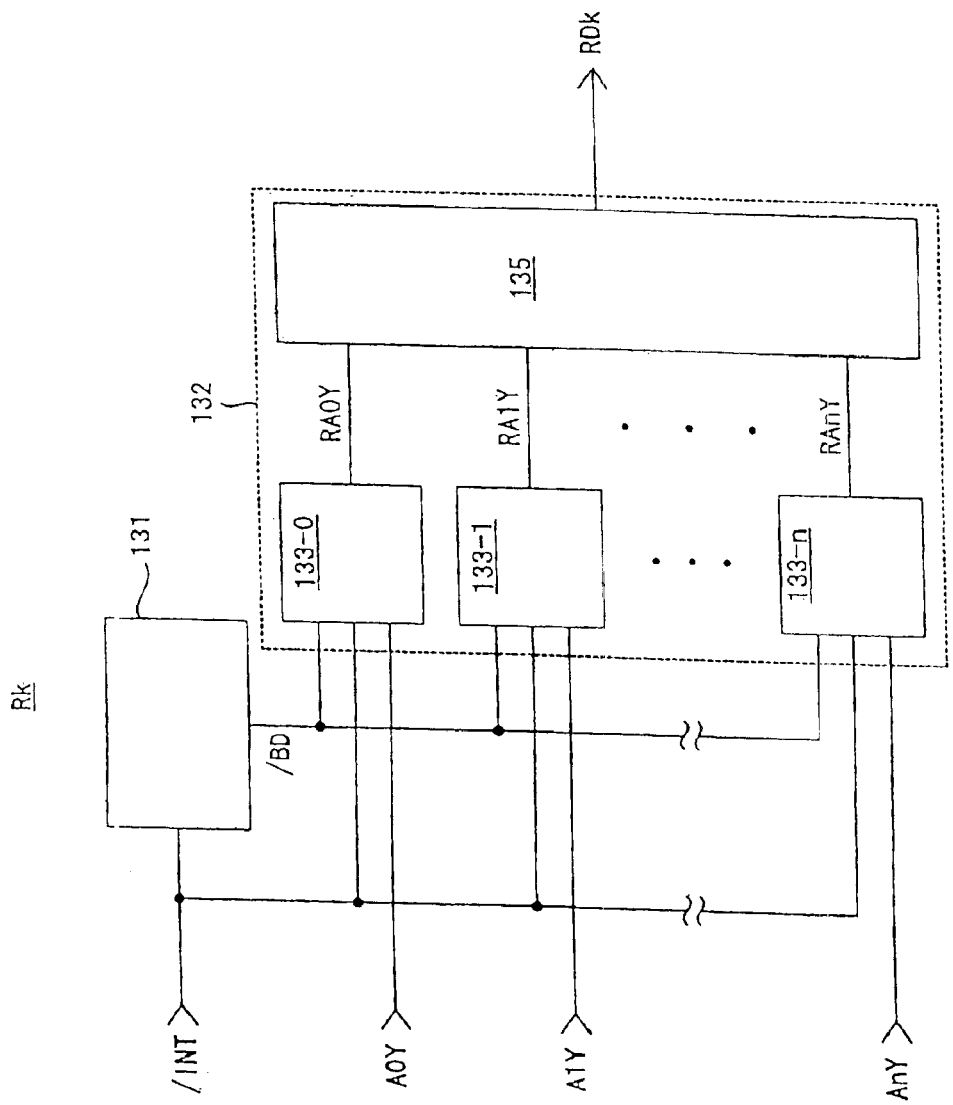
FIG. 3 is a block diagram showing a redundancy judgment circuit of the first embodiment of the present invention.

The redundant judgment circuit Rk includes a block judgment unit 131 and address judgment unit 132 as shown in FIG. 3. The address judgment unit 132 includes n+1 sub address judgment units 133-0 to 133-n and a logical operating unit 135.

The block judgment unit 131 has input thereto the initializing signal/INT and outputs the block judgment signal/BD.

Each of the sub address judgment units 133-0 to 133-n has input thereto the initializing signal/INT and the block judgment signal/BD. Also, each of the sub address judgment units 133-0 to 133-n has input thereto address signals A0Y to AnY respectively.

The logical operating unit 135 has input thereto address judgment signals RA0Y to RAnY from the sub address judgment units 133-0 to 133-n and outputs the redundant judgment signal RDk.

Figure 4:
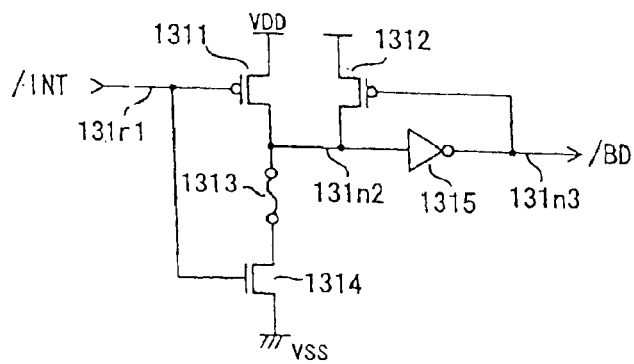
FIG. 4 is a circuit diagram showing a block judgment unit of the first embodiment of the present invention.

The block judgment unit 131 includes a P-channel transistor 1311, a P-channel transistor 1312, a fuse 1313, an N-channel transistor 1314, and an inverter 1315 as shown in FIG. 4.

A source electrode of the transistor 1311 and a source electrode of the transistor 1312 are connected to a first power supply voltage VDD. A drain electrode of the transistor 1311 and a drain electrode of the transistor 1312 are connected to a node 131n2. A gate electrode of the transistor 1311 is connected to a node 131n1, and a gate electrode of the transistor 1312 is connected to a node 131n3.

A first terminal of the fuse 1313 is connected to the node 131n2, and a second terminal of the fuse 1313 is connected to the drain electrode of the transistor 1314.

A gate electrode of the transistor 1314 is connected to the node 131n1, and a source electrode of the transistor 1314 is connected to the second power supply voltage VSS.

An input terminal of the inverter 1315 is connected to the node 131n2, and an output terminal of the inverter 1315 is connected to the node 131n3.

The block judgment unit 131 has input thereto the initializing signal/INT at the node 131n1, and outputs the block judgment signal/BD from the node 131n3. The block judgment signal/BD outputted from the block judgment unit 131 is inputted to the sub address judgment units 133-0 to 133-n.

The address judgment unit 132 in the redundant judgment circuit Rk includes n+1 sub address judgment units 133-0 to 133-n. Each of the sub address judgment units 133-0 to 133-n has a same structure. Therefore, in this embodiment, one sub address judgment unit 133-j($0 \leq j \leq n$) in the sub address judgment units 133-0 to 133-n is described.

Figure 5:
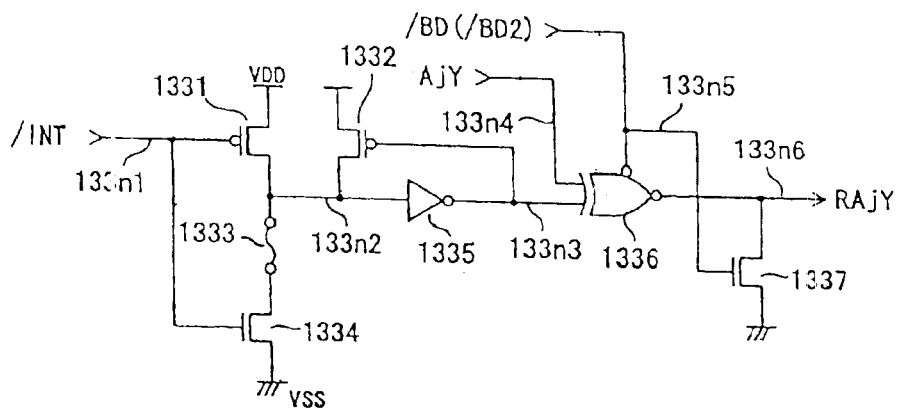
FIG. 5 is a circuit diagram showing a sub address judgment unit of the first embodiment of the present invention.

The sub address judgment unit 133-j includes a P-channel transistor 1331, a P-channel transistor 1332, a fuse 1333, an N-channel transistor 1334, an inverter 1335, an exclusive OR gate(ExOR gate) 1336, and an N-channel transistor 1337 as shown in FIG. 5.

A source electrode of the transistor 1331 and a source electrode of the transistor 1332 are connected to the first power supply voltage VDD. A drain electrode of the transistor 1331 and a drain electrode of the transistor 1332 are connected to a node 133n2. A gate electrode of the transistor 1331 is connected to a node 133n1, and a gate electrode of the transistor 1332 is connected to a node 133n3.

A first terminal of the fuse 1333 is connected to the node 133n2, and a second terminal of the fuse 1333 is connected to a drain electrode of the transistor 1334.

An input terminal of the inverter 1335 is connected to the node 133n2, and an output terminal of the inverter 1335 is connected to the node 133n3.

A first input terminal of the ExOR 1336 is connected to the node 133n3, a second input terminal of the ExOR 1336 is connected to a node 133n4, a power control terminal of the ExOR 1336 is connected to a node 133n5, and an output terminal of the ExOR 1336 is connected to a node 133n6.

A source electrode of the transistor 1337 is connected to the node 133n6, a gate electrode of the transistor 1337 is connected to the node 133n5, and a drain electrode of the transistor 1337 is connected to the second power supply voltage VSS.

The sub address judgment unit 133-j has input thereto the initializing signal/INT at the node 133n1, the address signal AjY at the node 133n4, and the block judgment signal /BD at the node 133n5, and outputs the address judgment signal RAjY from the node 133n6. Also, in other sub address judgment units 133-0 to 133-n, the initializing signal/INT, the address signals A0Y to AnY, and block judgment signal/BD are inputted, and the address judgment signal RA0Y to RAnY are outputted respectively. The address judgment signal RA0Y to RAnY outputted from the sub address judgment units are inputted to the logical operating unit 135.

Figure 6:
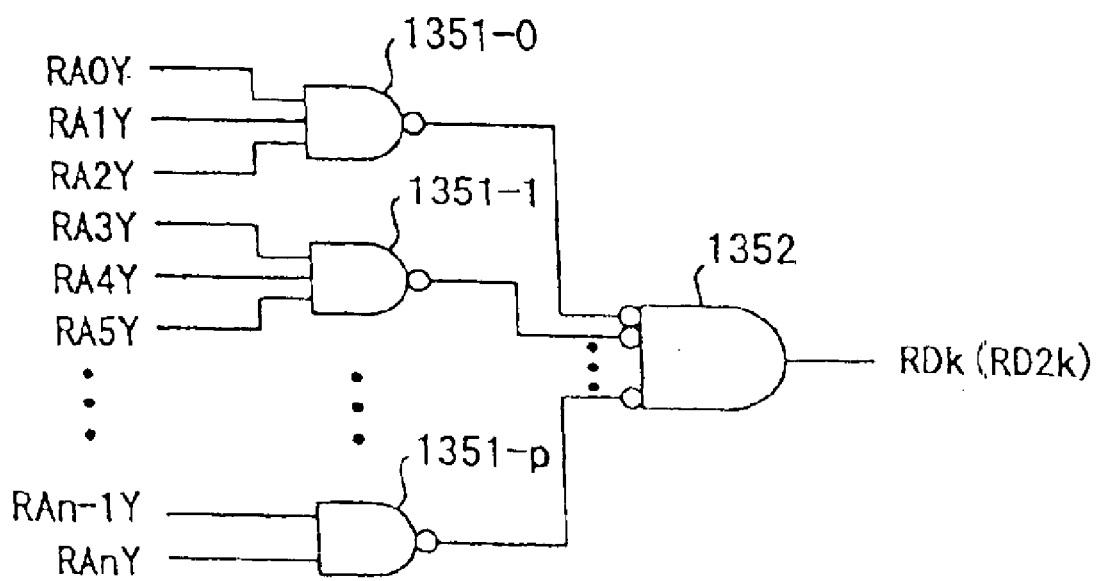
FIG. 6 is a circuit diagram showing a logical operation unit of the first embodiment of the present invention.

The logical operating unit 135 outputs the redundant judgment signal RDk which has an active state, when all the address judgment signals RA0Y to RAnY are asserted. The logical operating unit 135 includes p+1 NAND gates 1351-0 to 1351-p and a NOR gate 1352 as shown in FIG. 6. The address judgment signal RA0Y to RAnY are partitioned into p+1 groups, and inputted to each of NAND gates 1351-0 to 1351-p respectively. The NOR gate has input thereto signals from each NAND gates 1351-0 to 1351-p.

Next, an operation of the DRAM 101 of the first embodiment of the present invention is described.

A data writing operation and a data reading operation to all the memory cell arrays MA0 to MAm are performed as a test for detecting the defective portion. Information of the defective portion is programmed in the redundant judgment circuit which is corresponding to the memory cell array which has the defective portion.

In this embodiment, the defective portion is included in the memory cell array MAk, and the defective portion is accessed by an "L" level address signal A0Y and "H" level address signals A1Y to AnY.

The information of the defective portion is programmed in the redundant judgment circuit Rk. That is, the fuse 1313 in the block judgment unit 131 in the redundant judgment circuit Rk is cut electrically or by a laser equipment. Other fuses which are included in other redundant judgment circuits R0 to Rm(except the Rk) are not cut.

During the test, the defective portion is found in the point which is accessed by the "L" level address signal A0Y and the "H" level address signals A1Y to AnY. The address information of the defective portion is programmed in the redundant judgment circuit Rk. That is, the fuse 1333 in the sub address judgment unit 133-0 which is inputted the address signal A0Y is cut electrically or by the laser equipment.

If the fuses are cut, the defective portion is replaced by the normal portion in the redundant memory cell array. Therefore, the data can be written correctly to the DRAM 101 and can be read correctly from the DRAM 101.

The control unit 113 asserts the initializing signal/INT and initializes the redundant judgment circuits R0 to Rm before the writing operation or the reading operation is performed. The initializing signal/INT is preferably asserted, when power is applied to the DRAM 101 or before a row address is inputted to the DRAM 101. In the conventional DRAM, the row address is inputted before a column address. Therefore, if the initializing signal/INT is asserted before the row address signal is inputted, the redundant judgment circuits R0 to Rm can be initialized before the data transferring operation.

Next, the initializing operation for the redundant judgment circuit Rk which corresponds to the memory cell array MAk which includes the defective portion is described.

When the initializing signal/INT is changed to the "L" level, the node 131n2 in the block judgment unit 131 in the redundant judgment circuit Rk is changed to the "H" level. The "H" level of the node 131n2 and the "L" level of the node 131n3 are latched by the inverter 1315 and the transistor 1312. As a result, the block judgment unit 131 in the redundant judgment circuit Rk keeps outputting the "L" level of the block judgment signal /BD.

Since the sub address judgment units 133-0 to 133-n in the redundant judgment circuit Rk have input thereto the block judgment signal/BD from the block judgment circuit 131, the power control terminals of each of the ExOR gates become enabled and each of the sub address judgment units 133-0 to 133-n can judge the address signal A0Y to AnY. The transistors 1337 of each of the sub address judgment units 133-0 to 133-n are turned off, and the sub address judgment units 133-0 to 133-n can output the address judgment signal RA0Y to RAnY.

The sub address judgment units 133-0 to 133-n are initialized by inputting thereto the "L" level of the initializing signal/INT.

In this embodiment, only the fuse 1333 in the sub address judgment unit 133-0 in the redundant judgment circuit Rk is cut. The other fuses 1333 in the sub address judgment units 133-1 to 133-n in the redundant judgment circuit Rk are not cut.

The node 133n2 in the sub address judgment unit 133-0 changes to the "H" level, when the initializing signal/INT changes to the "L" level. The "H" level on the node 133n2 and the "L" level on the node 133n3 are latched by the inverter 1335 and the transistor 1332. Since the level of the node 133n2 and the node 133n3 are latched, the level of the nodes are not changed, when the level of the initializing signal/INT is changed.

The nodes 133n2 in the sub address judgment units 133-1 to 133-n change to the "H" level, when the initializing signal/INT changes to the "L" level. However, when the initializing signal/INT changes to the "H" level, the transistors 1334 in the sub address judgment units 133-1 to 133-n are turned on. Therefore, the nodes 133n2 in the judgment units 133-1 to 133n change to the "L" level and the nodes 133n3 in the judgment units 133-1 to 133n change to the "H" level. Since the initializing signal/INT keeps the "H" level after the initializing operation, the nodes 133n3 in the sub address judgment units 133-1 to 133-n keep the "H" level.

Next, the initializing operation in the redundant judgment circuits R0 to Rm in the blocks BL0 to BLm that the defective portion is not included, is described. The redundant judgment circuit Rk is not included in this group of the redundant judgment circuits R0 to Rm.

The nodes 131n2 in the block judgment units 131 in the redundant judgment circuits R0 to Rm (except Rk) are changed to the "H" level in response to the "L" level of the initializing signal/INT. When the initializing signal changed to the "H" level, the transistors 1314 in the each block judgment units 131 are turned on. Therefore, the nodes 131n2 are changed to the "L" level and the nodes 131n3 are changed to the "H" level. Since the initializing signal/INT keeps the "H" level after the initializing, the nodes 131n3 in the block judgment circuits R0 to Rm (except Rk) keep outputting the "H" level of the block judgment signal/BD.

The sub address judgment units 133-0 to 133-n receive the negated block judgment signal/BD from the block judgment unit 131. Therefore, the power control terminal of the ExOR gate 1336 enters a disable state. As a result, the sub address judgment units 133-0 to 133-n do not judge the address signals A0Y to AnY. That is, each of the sub address judgment units 133-0 to 133-n outputs the "L" level of the address judgment signal RA0Y to RAnY regardless of the value of the address signal A0Y to AnY.

When all the sub address judgment units 133-0 to 133-n output the "L" level of the address judgment signals RA0Y to RAnY, the logical operating unit 135 outputs the "L" level signal.

After the initializing operation, the data writing operation, the data reading operation and the redundancy operation are performed to the DRAM as described below.

The control unit 113 selects the block by using the block selecting signals BS0 to BSm, when the data writing operation or the data reading operation to the DRAM 101 is to occur.

The address buffer unit 111 outputs the address signals A0Y to AnY for deciding the memory cell to access.

The address signals A0Y to AnY are inputted to all the redundant judgment circuits R0 to Rm. Accordingly, since the fuse 1313 in the redundant judgment circuit Rk is cut, the redundant judgment circuit Rk performs the address judgment operation. However, the other redundant judgment circuits R0 to Rm (except Rk) output the "L" level redundant judgment signals RD0 to RDm (except RDk) without performing the address judgment operation.

When the address signals A0Y to AnY which correspond to the defective portion is inputted to the redundant judgment circuit Rk, the sub address judgment units 133-0 to 133-n in the redundant judgment circuit Rk output the "H" level of the address judgment signals RA0Y to RAnY, and the output terminal of the logical operating unit 135 changes to the "H" level. As a result, the redundant judgment circuit Rk outputs the "H" level of the redundant judgment signal RDk.

When the address signals A0Y to AnY which do not correspond to the defective portion are inputted to the redundant judgment circuit Rk, one of the sub address judgment units outputs the "L" level of the address judgment signal. Therefore, the redundant judgment circuit Rk outputs the "L" level of the redundant judgment signal RDk.

When the control unit 113 outputs the "H" level of the block selecting signal BSk and the redundant judgment circuit Rk outputs the "H" level of the redundant judgment signal RDk, the logic gate LGk−1/k outputs the "H" level of the redundant selecting signal RSk−1/k and the logic gate LGk/k+1 outputs the "H" level of the redundant selecting signal RSk/k+1.

When the redundant sense amplifier unit RSAk−1/k receives the "H" level of the redundant selecting signal RSk−1/k and the redundant sense amplifier unit RSk/k+1 receives the "H" level of the redundant selecting signal RSk/k+1, the bit lines RBL0 to RBL3 in the redundant memory cell array RMAk become an active state.

When the DRAM 101 performs the data writing operation, the write enable signal /WE is asserted and one of the word lines WL0 to WLi is activated. Therefore, the data is written from the sub writing data bus SWDB to the selected memory cell in the redundant memory cell array RMAk. When the DRAM 101 performs the data reading operation, the data in the selected memory cell is read to the sub read data bus SRDB by activating one of the word lines WL0 to WLi. In this operation, the memory cell array MAk which includes the defective portion is replaced to the redundant memory cell array RMAk.

If the accessing operation is performed to the normal memory cell in the memory cell array MAk which includes the defective memory cell, the redundant judgment circuit Rk outputs the "L" level of the redundant judgment signal RDk in response to the address signals A0Y to AnY. If the control unit 113 outputs the "H" level of the block selecting signal BSk for selecting the block BLk, the logic gate LGk−1/k outputs the "L" level of the redundant selecting signal RSk−1/k and the logic gate LGk/k+1 outputs the "L" level of the redundant selecting signal RSk/k+1. Therefore, the DRAM 101 performs the data writing operation and the data reading operation to the memory cell array MAk without performing the data writing operation and the data reading operation to the redundant memory cell array RMAk.

When the control unit 113 outputs the "L" level of the block selecting signal BSk and the block BLk is not selected, the logic gate LGk−1/k outputs the "L" level of the redundant selecting signal RSk−1/k and the logic gate LGk/k+1 outputs the "L" level of the redundant selecting signal RSk/k+1, if the redundant judgment circuit Rk asserts the "H" level of the redundant judgment signal RDk. That is, the DRAM 101 does not perform the data writing operation and the data reading operation to the memory cell array MAk and the redundant memory cell array RMAk, if the "L" level of the block selecting signal BSk is received.

The redundant judgment circuits R0 to Rm (except Rk) do not need to perform judging for the redundancy operation, because the defective portion is not included in the corresponding memory cell arrays. Therefore, the redundant judgment circuits R0 to Rm (except Rk) output the "L" level of the redundant judgment signal RD0 to RDm (except RDk). The logic gate LG0, LG0/1, . . . , LGm−1/m, and LGm (except LGk−1/k and LGk/k+1) output the "L" level of the redundant selecting signal RS0, RS0/1, . . . , RSm (except RSk−1/k and RSk/k+1) regardless of the level of the block selecting signal BS0 to BSm. As a result, the DRAM 101 does not perform the data writing operation and the data reading operation to the redundant memory cell arrays RMA0 to RMAm (except RMAk).

In this embodiment, the redundant judgment circuit which corresponds to the memory cell array which includes the defective portion performs the address judgment operation for replacing the redundant memory cell array. The redundant judgment circuit which corresponds to the memory cell array which does not include the defective portion does not perform the address judgment operation for replacing the redundant memory cell array. That is, the address judgment operation is performed only by the redundant judgment circuit that the address judgment operation is needed. As a result, if the number of the blocks are increased, the power consumption of the DRAM 101 can be reduced.

SECOND PREFERRED EMBODIMENT

Figure 7:
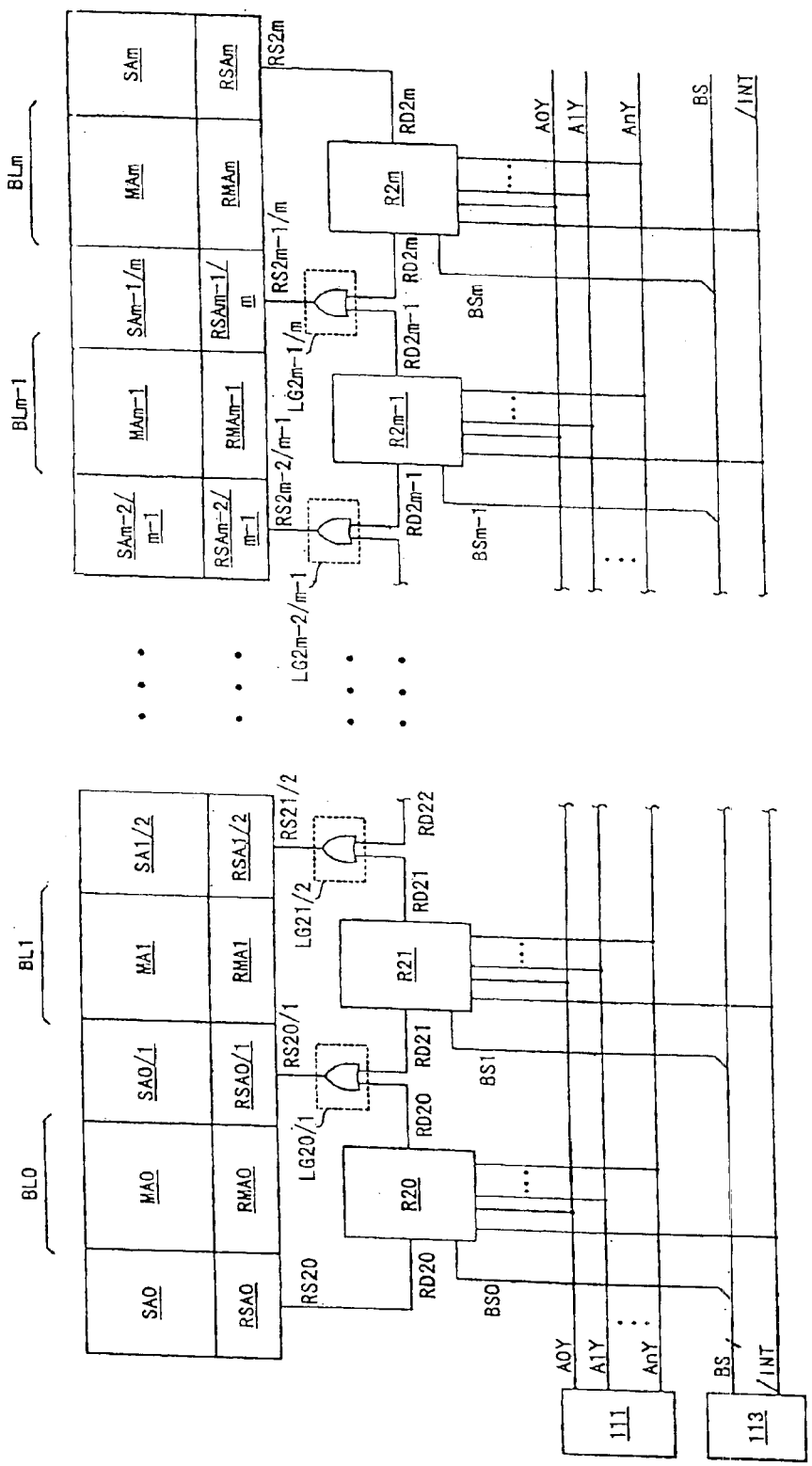
FIG. 7 is a block diagram showing a DRAM of a second embodiment of the present invention.

FIG. 7 is a block diagram showing a DRAM 201 of a second embodiment of the present invention.

The DRAM 201 includes m+1 blocks BL0 to BLm. The blocks BL0 to BLm include memory cell arrays MA0 to MAm, redundant memory arrays RMA0 to RMAM, and redundant judgment circuit R20 to R2m respectively. That is, the block BLk(0≦k≦m) includes the memory cell array MAk, the redundant memory cell array RMAk and the redundant judgment circuit R2k. Accordingly, the memory cell array is divided to the m+1 blocks and accessed for each blocks, a data writing operation and a data reading operation can be performed with high-speed.

If any of the memory cell arrays MA0 to MAm includes the defective memory portion, the defective memory portion is replaced by the normal memory cell in the corresponding redundant memory cell arrays RMA0 to RMAm. The redundant judgment circuits R20 to R2m judge the replacement.

Sense amplifier units SA0/1, SA1/2, . . . , SAm−1/m are arranged between each memory cell arrays MA0 to MAm. A sense amplifier SA0 is arranged outside of the memory cell array MA0 and a sense amplifier SAm is arranged outside of the memory cell array MAm.

The sense amplifier SA0/1 and the sense amplifier SA1/2 read data from the memory cell array MA1 by amplifying a voltage of a bit line in the memory cell array MA1 and write data to the memory cell array MA1. Also, other sense amplifiers perform the writing operation and the reading operation to the adjacent memory cell arrays. That is, each of the sense amplifiers SA0/1 to SAm−1/m are shared by the memory cell arrays which are arranged at both sides of these sense amplifiers.

The redundant sense amplifiers RSA0 to RSAm are used for the redundant memory cell arrays RMA0 to RMAm. The relationship between the redundant memory cell arrays RMA0 to RMAm and the redundant sense amplifiers RSA0 to RSAm is substantially same as the relationship between the memory cell arrays MA0 to MAm and the sense amplifiers SA0 to SAm. That is, the redundant sense amplifier RSA0/1 and the redundant sense amplifier RSA1/2 read data from the redundant memory cell array RMA by amplifying a voltage of a bit line in the redundant memory cell array RMA1 and write data to the redundant memory cell array RMA1. Also, other redundant sense amplifiers perform the data writing operation and the data reading operation to the adjacent redundant memory cell arrays. That is, each of redundant sense amplifiers RSA0/1 to RSAm−1/m are shared by the redundant memory cell arrays which are arranged at both side of the redundant sense amplifier.

Logic gates LG20/1, LG21/2, . . . , LG2m−1/m are arranged between each redundant judgment circuit R20 to R2m. Each of the logic gates LG20/1, LG21/2, . . . , LG2m−1/m includes an OR gate.

For example, the logic gate LG20/1 which is arranged between the redundant judgment circuit R20 and the redundant judgment circuit R21 includes the OR gate which has input thereto a redundant judgment signal RD20 from the redundant judgment circuit R20 and a redundant judgment signal RD21 from the redundant judgment circuit R21. An output terminal of the OR gate is connected to an input terminal of the redundant sense amplifier RSA0/1.

The sense amplifier unit RSA0 has input thereto the redundant judgment signal RD20 from the redundant judgment circuit R20 directly, and the sense amplifier unit RSAm has input thereto the redundant judgment signal RD2m from the redundant judgment circuit R2m directly.

The redundant judgment circuits R20 to R2m have input thereto address signals A0Y to AnY from an address buffer unit 111 and an initializing signal/INT from the control unit 113. The redundant judgment circuits R20 to R2m input the block selecting signals BS0 to BSm from the control unit 113.

Next, a structure of the redundant judgment circuits R20 to R2m is described. Each of the redundant judgment circuits R20 to R2m has a similar structure. Therefore, in this embodiment, one of the redundant judgment circuit R2k (0≦k≦m) is described.

Figure 8:
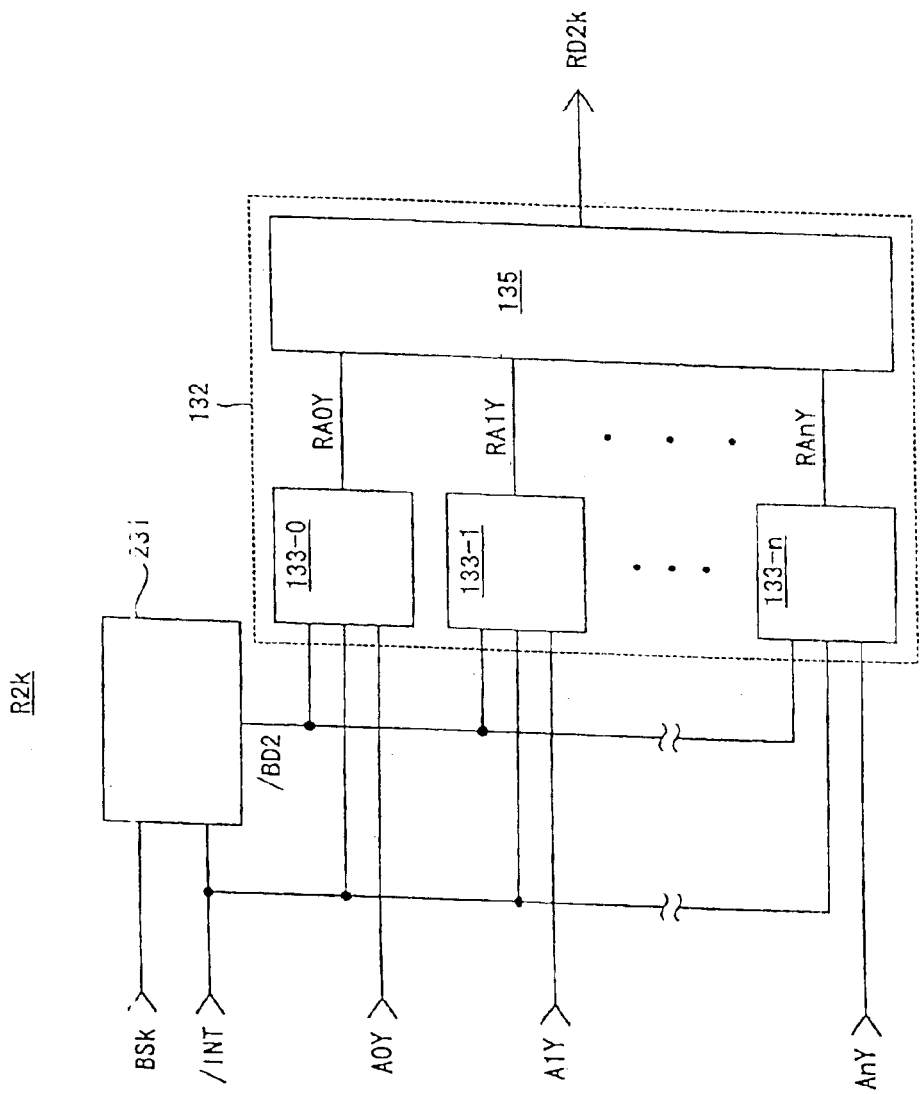
FIG. 8 is a block diagram showing a redundancy judgment circuit of the second invention of the present invention.

The redundant judgment circuit R2k includes a block judgment unit 231 and address judgment unit 132 as shown in FIG. 8.

The block judgment unit 231 has input thereto the initializing signal/INT and the block selecting signal BSk, and outputs the block judgment signal/BD2.

Each of the sub address judgment units 133-0 to 133-n has input thereto the initializing signal/INT and the block judgment signal/BD2. Also, each of the sub address judgment units 133-0 to 133-n has input thereto address signals A0Y to AnY respectively.

The logical operating unit 135 inputs address judgment signals RA0Y to RAnY from the sub address judgment units 133-0 to 133-n and outputs the redundant judgment signal RD2k.

Figure 9:
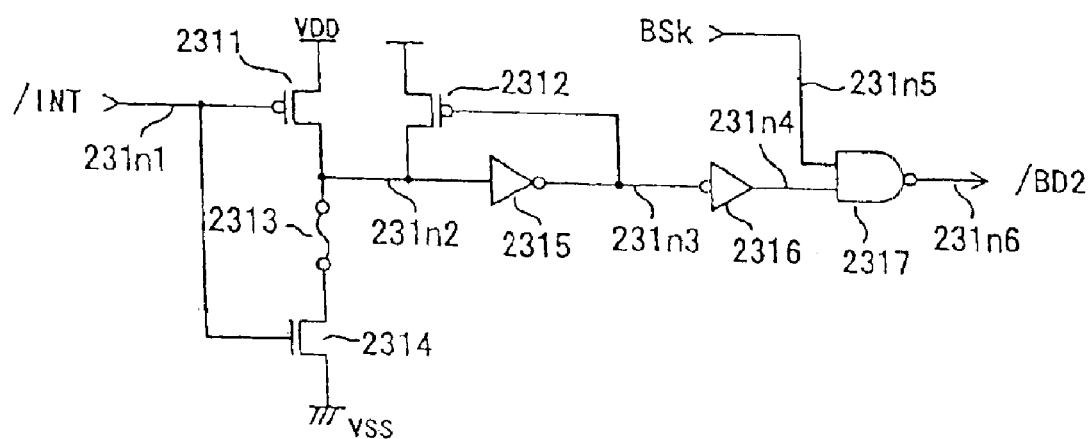
FIG. 9 is a circuit diagram showing a block judgment unit of the second embodiment of the present invention.

The block judgment unit 231 includes a P-channel transistor 2311, a P-channel transistor 2312, a fuse 2313, an N-channel transistor 2314, an inverter 2315, an inverter 2316 and an NAND gate 2317 as shown in FIG. 9.

A source electrode of the transistor 2311 and a source electrode of the transistor 2312 are connected to a first power supply voltage VDD. A drain electrode of the transistor 2311 and a drain electrode of the transistor 2312 are connected to a node 231n2. A gate electrode of the transistor 2311 is connected to a node 231n1, and a gate electrode of the transistor 2312 is connected to a node 231n3.

A first terminal of the fuse 2313 is connected to the node 231n2, and a second terminal of the fuse 2313 is connected to the drain electrode of the transistor 2314.

A gate electrode of the transistor 2314 is connected to the node 231n1, and a source electrode of the transistor 2314 is connected to the second power supply voltage VSS.

An input terminal of the inverter 2315 is connected to the node 231n2, and an output terminal of the inverter 2315 is connected to the node 231n3.

An input terminal of the inverter 2316 is connected to the node 231n3, and an output terminal of the inverter 2316 is connected to a node 231n4.

A first input terminal of the NAND gate 2317 is connected to the node 231n4, a second input terminal of the NAND gate 2317 is connected to a node 231n5, and an output terminal of the NAND gate 2317 is connected to a node 231n6.

The block judgment unit 131 has input thereto the initializing signal/INT at the node 231n1 and the block selecting signal BSk in the node 231n5, and outputs the block judgment signal/BD2 from the node 231n6. The block judgment signal/BD2 outputted from the block judgment unit 131 is inputted to the sub address judgment units 133-0 to 133-n.

The sub address judgment units 133-0 to 133-n in the redundant judgment circuit R2k in the second embodiment have the same structure as the sub address judgment units 133-0 to 133n as shown in FIG. 5. In this embodiment, the block judgment signal/BD2 is inputted to the block judgment units 133-0 to 133-n instead of the block judgment signal /BD. The logical operating unit 135 in this embodiment has the same structure as the logical operating unit 135 in the first embodiment as shown in FIG. 6.

Next, an operation of the DRAM 201 of the first embodiment of the present invention is described.

A data writing operation and a data reading operation to all the memory cell arrays MA0 to MAm are performed as a test for detecting the defective portion. Information of the defective portion is programmed in the redundant judgment circuit which corresponding to the memory cell array which has the defective portion.

In this embodiment, the defective portion is included in the memory cell array MAk, and the defective portion is accessed by an "L" level address signal A0Y and a "H" level address signals A1Y to AnY.

The information of the defective portion is programmed in the redundant judgment circuit R2k. That is, the fuse 2313 in the block judgment unit 231 in the redundant judgment circuit R2k is cut electrically or by a laser equipment. Other fuses which are included in other redundant judgment circuits R20 to R2m (except the R2k) are not cut.

During the test, the defective portion is found in the point which is accessed by the "L" level address signal A0Y and the "H" level address signals A1Y to AnY The address information of the defective portion is programmed in the redundant judgment circuit R2k. That is, the fuse 1333 in the sub address judgment unit 133-0 which is inputted the address signal A0Y is cut electrically or by the laser equipment.

If the fuses are cut, the defective portion is replaced by the normal portion in the redundant memory cell array. Therefore, the data can be written correctly to the DRAM 201 and can be read correctly from the DRAM 201.

The control unit 113 asserts the initializing signal/INT and initializes the redundant judgment circuits R20 to R2m before the writing operation or the reading operation is performed. The initializing signal/INT is preferably asserted, when power is applied to the DRAM 201 or before a row address is inputted to the DRAM 201. In the conventional DRAM, the row address is inputted before a column address. Therefore, if the initializing signal/INT is asserted before the row address signal is inputted, the redundant judgment circuits R20 to R2m can be initialized before the data transferring operation.

Next, the initializing operation for the redundant judgment circuit R2k which corresponds to the memory cell array MAk which includes the defective portion is described.

When the initializing signal/INT is changed to the "L" level, the node 231n2 in the block judgment unit 231 in the redundant judgment circuit R2k is changed to the "H" level. The node 231n2 is latched to the "H" level, the node 231n3 is latched to the "L" level, and the node 231n4 is latched to the "H" level by the transistor 2312 and the inverter 2315. That is, the transistor 2312 and the inverter 2315 make a latching circuit. Since the node 231n4 is the "H" level, the NAND gate 2317 controls the node 231n6 in response to the level of the block selecting signal BSk. As a result, the block judgment unit 231 in the redundant judgment circuit R2k outputs the "L" level of the block judgment signal/BD2, when the block selecting signal BSk is the "H" level, and outputs the "H" level of the block judgment signal/BD2, when the block selecting signal BSk is the "L" level.

When the control unit 113 outputs the "H" level of the block selecting signal BSk for accessing the block BLk, the block judgment signal/BD2 is asserted from the block judgment unit 231 to the sub address judgment units 133-0 to 133-n in the redundant judgment circuit R2k. Therefore, the each of the power control terminals of the ExOR gates 1336 in the sub address judgment units 133-0 to 133-n become enable state, and the sub address judgment units 133-0 to 133-n become available to judge the address signals A0Y to AnY. The each transistors 1337 in the sub address judgment units 133-0 to 133-nare turned off, and the sub address judgment units 133-0 to 133-n become available to output the address judgment signal RA0Y to RAnY.

When the logic control unit 113 outputs the "L" level of the block control signal BSk, the block judgment signal/BD from the block judgment unit 231 to the sub address judgment units 133-0 to 133-n in the redundant judgment circuit R2k is negated. Therefore, each of the power control terminals of the ExOR gates 1336 in the sub address judgment units 133-0 to 133-n become disable state, and the sub address judgment units 133-0 to 133-n do not judge the address signal A0Y to AnY. Each of the transistors 1337 in the sub address judgment units 133-0 to 133-n is turned on, and the sub address judgment units 133-0 to 133-n output the "L" level of the address judgment signal RA0Y to RAnY.

The sub address judgment units 133-0 to 133-n are initialized by inputting thereto the "L" level of the initializing signal/INT.

In this embodiment, only the fuse 1333 in the sub address judgment unit 133-0 in the redundant judgment circuit R2k is cut. The other fuses 1333 in the sub address judgment units 133-1 to 133-n in the redundant judgment circuit R2k are not cut.

The node 133n2 in the sub address judgment unit 133-0 changes to the "H" level, when the initializing signal/INT changes to the "L" level. The "H" level on the node 133n2 and the "L" level on the node 133n3 are latched by the transistor 1332 and the inverter 1335. Since the level of the node 133n2 and the node 133n3 are latched, the level of the nodes are not changed, when the level of the initializing signal/INT is changed.

The nodes 133n2 in the sub address judgment units 133-1 to 133-n change to the "H" level, when the initializing signal/INT changes to the "L" level. However, when the initializing signal/INT changes to the "H" level, the transistors 1334 in the sub address judgment units 133-1 to 133-n are turned on. Therefore, the nodes 133n2 in the judgment units 133-1 to 133n change to the "L" level and the nodes 133n3 in the judgment units 133-1 to 133n change to the "H" level. Since the initializing signal/INT keeps the "H" level after the initializing operation, the nodes 133n3 in the sub address judgment units 133-1 to 133-n keep the "H" level.

Next, the initializing operation in the redundant judgment circuits R0 to Rm in the block BL0 to BLm that the defective portion is not included, is described. The redundant judgment circuit Rk is not included in this group of the redundant judgment circuits R0 to Rm.

The nodes 231n2 in the block judgment units 231 in the redundant judgment circuits R20 to R2m (except R2k) are changed to the "H" level in response to the "L" level of the initializing signal/INT. When the initializing signal changed to the "H" level, the transistors 2314 in the each block judgment units 231 are turned on. Therefore, the nodes 231n2 are changed to the "L" level, the nodes 231n3 are changed to the "H" level, and the node 231n4 is changed to the "L" level. Since the initializing signal/INT keeps the "H"

level after the initializing, the nodes 231n6 in each of the block judgment units 231 keep the "H" level. As a result, each of the block judgment units 231 in the block judgment circuits R20 to R2m (except R2k) keep the outputting the "H" level of the block judgment signal/BD2.

The sub address judgment units 133-0 to 133-n receive the negated block judgment signal/BD2 from the block judgment unit 231. Therefore, the power control terminal of the ExOR gate 1336 enters a disable state. As a result, the sub address judgment units 133-0 to 133-n do not judge the address signals A0Y to AnY. That is, each of the sub address judgment units 133-0 to 133-n outputs the "L" level of the address judgment signal RA0Y to RAnY regardless of the value of the address signal A0Y to AnY When all sub address judgment units 133-0 to 133-n output the "L" level of the address judgment signals RA0Y to RANY, the logical operating unit 135 outputs the "L" level signal.

After the initializing operation, the data writing operation, the data reading operation and the redundancy operation are performed to the DRAM as described below.

The control unit 113 selects the block by using the block selecting signals BS0 to BSm, when the data writing operation or the data reading operation to the DRAM 201 is to occur.

The address buffer unit 111 outputs the address signals A0Y to AnY for deciding the memory cell to access.

The address signals A0Y to AnY are inputted to all the redundant judgment circuits R20 to R2m. Accordingly, since the fuse 2313 in the redundant judgment circuit R2k is cut, the redundant judgment circuit R2k performs the address judgment operation. However, the other redundant judgment circuits R20 to R2m (except R2k) output the "L" level redundant judgment signals RD20 to RD2m (except RD2k) without performing the address judgment operation.

When the address signals A0Y to AnY which correspond to the defective portion is inputted to the redundant judgment circuit R2k, the sub address judgment units 133-0 to 133-n in the redundant judgment circuit R2k output the "H" level of the address judgment signals RA0Y to RAnY, and the output terminal of the logical operating unit 135 changes to the "H" level. As a result, the redundant judgment circuit R2k outputs the "H" level of the redundant judgment signal RD2k.

When the address signals A0Y to AnY which do not correspond to the defective portion are inputted to the redundant judgment circuit R2k, one of the sub address judgment units outputs the "L" level of the address judgment signal. Therefore, the redundant judgment circuit R2k outputs the "L" level of the redundant judgment signal RD2k.

When the redundant judgment circuit R2k outputs the "H" level of the redundant judgment signal RD2k, the logic gate LG2k-1/k outputs the "H" level of the redundant selecting signal RS2k-1/k and the logic gate LG2k/k+1 outputs the "H" level of the redundant selecting signal RS2k/k+1.

When the redundant sense amplifier unit RSAk-1/k receives the "H" level of the redundant selecting signal RS2k-1/k and the redundant sense amplifier unit RSk/k+1 receives the "H" level of the redundant selecting signal RS2k/k+1, the bit lines RBL0 to RBL3 in the redundant memory cell array RMAk become an active state.

When the DRAM 201 performs the data writing operation, the write enable signal /WE is asserted and one of the word lines WL0 to WLi is activated. Therefore, the data is written from the sub writing data bus SWDB to the selected memory cell in the redundant memory cell array RMAk. When the DRAM 201 performs the data reading operation, the data in the selected memory cell is read to the sub read data bus SRDB by activating one of the word lines WL0 to WLi. In this operation, the memory cell array MAk which includes the defective portion is replaced to the redundant memory cell array RMAk.

If the accessing operation is performed to the normal memory cell in the memory cell array MAk which includes the defective memory cell, the redundant judgment circuit R2k outputs the "L" level of the redundant judgment signal RD2k in response to the address signals A0Y to AnY. The logic gate LG2k-1/k outputs the "L" level of the redundant selecting signal RS2k-1/k and the logic gate LG2k/k+1 outputs the "L" level of the redundant selecting signal RS2k/k+1. Therefore, the DRAM 201 performs the data writing operation and the data reading operation to the memory cell array MAk without performing the data writing operation and the data reading operation to the redundant memory cell array RMAk.

When the control unit 113 outputs the "L" level of the block selecting signal BSk and the block BLk is not selected, the redundant judgment circuit R2k outputs the "L" level of the redundant judgment signal RD2k. The logic gate LG2k-1/k outputs the "L" level of the redundant selecting signal RS2k-1/k and the logic gate LG2k/k+1 outputs the "L" level of the redundant selecting signal RS2k/k+1. That is, the DRAM 201 does not perform the data writing operation and the data reading operation to the memory cell array MAk and the redundant memory cell array RMAk.

The redundant judgment circuits R20 to R2m (except R2k) do not need to perform judging for the redundancy operation, because the defective portion is not included in the corresponding memory cell arrays. Therefore, the redundant judgment circuits R20 to R2m (except R2k) output the "L" level of the redundant judgment signal RD20 to RD2m (except RD2k) regardless of the level of the block selecting signals BS20 to BS2m (except the BS2k). The logic gate LG20, LG20/1, . . . , LG2m-1/m, and LG2m (except LG2k-1/k and LG2k/k+1) output the "L" level of the redundant selecting signal RS20, RS20/1, . . . , RS2m (except RS2k-1/k and RS2k/k+1). As a result, the DRAM 201 does not perform the data writing operation and the data reading operation to the redundant memory cell arrays RMA0 to RMAm (except RMAk).

In this embodiment, the redundant judgment circuit which corresponds to the memory cell array which includes the defective portion performs the address judgment operation for replacing the redundant memory cell array. The redundant judgment circuit which corresponds to the memory cell array which does not include the defective portion does not perform the address judgment operation for replacing the redundant memory cell array. That is, the address judgment operation is performed only by the redundant judgment circuit that the address judgment operation is needed. As a result, if the number of the blocks are increased, the power consumption of the DRAM 201 can be reduced.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor memory device comprising:
   a plurality of memory cell arrays, each of which includes
      a plurality of memory cells;

a plurality of redundant judgment circuits, each of which is used for storing an address of a defective memory cell of the corresponding memory cell array, wherein each of the redundant judgment circuits include a block judgment unit which outputs a block judgment signal and an address judgment unit which outputs a redundant judgment signal; and a redundant memory cell array, wherein the block judgment unit outputs the block judgment signal when the corresponding memory cell array includes the defective memory cell, and wherein the address judgment unit outputs the redundant judgment signal when the block judgment signal is output from the block judgment unit and the address of the defective memory cell matches an external address, so that the redundant memory cell array is accessed in place of the corresponding memory cell array which includes the defective memory cell.

2. The semiconductor memory device of claim 1, wherein the block judgment unit includes a fuse.

3. The semiconductor memory device of claim 2, wherein each of the block judgment units including a latching circuit which latches a level of the block judgment signal in response to a connection state of the fuse.

4. The semiconductor memory device of claim 1, wherein the address judgment unit includes a fuse, and wherein the address judgment unit judges the address of the defective memory cell in response to a connection of state of the fuse.

5. The semiconductor memory device of claim 1, wherein the address judgment unit comprises a comparing circuit which includes a plurality of comparing gates, wherein the external address and the address of the defective memory cell are compared at every bit in the respective comparing gate.

6. A semiconductor memory device comprising:

a plurality of memory cell arrays, each of which includes a plurality of memory cells;

a plurality of redundant judgment circuits, each of which is used for storing an address of a defective memory cell of the corresponding memory cell array, wherein each of the redundant judgment circuits include a block judgment unit which outputs a block judgment signal and an address judgment unit which outputs a redundant judgment signal; and a redundant memory cell array, wherein the block judgment unit outputs the block judgment signal when the corresponding memory cell array is selected and the corresponding memory cell array includes the defective memory cell, and wherein address judgment unit outputs the redundant judgment signal when the address of the defective memory cell matches an external address, so that the redundant memory cell array is accessed in place of the corresponding memory cell array which includes the defective memory cell.

7. The semiconductor memory device of claim 6, wherein the block judgment unit includes a fuse.

8. The semiconductor memory device of claim 7, wherein each of the block judgment unit including a latching circuit which latches a level of the block judgment signal in response to a connection state of the fuse.

9. The semiconductor memory device of claim 6, wherein the address judgment unit includes a fuse, and wherein the address judgment unit judges the address of the defective memory cell in response to a connection of state of the fuse.

10. The semiconductor memory device of claim 6, wherein the address judgment unit comprises a comparing circuit which includes a plurality of comparing gates, wherein the external address and the address of the defective memory cell are compared at every bit in the respective comparing gate.

* * * * *